United States Patent [19]
Tsai et al.

[11] Patent Number: 5,691,212
[45] Date of Patent: Nov. 25, 1997

[54] MOS DEVICE STRUCTURE AND INTEGRATION METHOD

[75] Inventors: Chaochieh Tsai, Taichung; Shun-Liang Hsu, Hsin-Chu, both of Taiwan

[73] Assignee: Taiwan Semiconductor Manufacturing Company, Ltd., Hsin-Chu, Taiwan

[21] Appl. No.: 721,665

[22] Filed: Sep. 27, 1996

[51] Int. Cl.⁶ .................................... H01L 21/265
[52] U.S. Cl. ........................ 437/24; 437/29; 437/40; 437/46; 437/200
[58] Field of Search .................... 437/20, 24, 27, 437/29, 46, 405 W, 415 W, 101, 162, 109, 200, 933, 950, 959, 413

[56] References Cited

U.S. PATENT DOCUMENTS

| | | | |
|---|---|---|---|
| 4,885,259 | 12/1989 | Osinski et al. | 437/41 |
| 4,978,629 | 12/1990 | Komori et al. | 437/46 |
| 5,322,809 | 6/1994 | Moslehi | 437/41 |
| 5,398,687 | 3/1995 | Liang | 437/46 |
| 5,407,847 | 4/1995 | Hayden et al. | 437/162 |
| 5,409,853 | 4/1995 | Yu | 437/200 |
| 5,459,101 | 10/1995 | Fujii et al. | 437/57 |
| 5,468,662 | 11/1995 | Hauemann | 437/40 |
| 5,510,296 | 4/1996 | Yen et al. | 437/46 |
| 5,585,295 | 12/1996 | Wu | 437/29 |
| 5,620,912 | 4/1997 | Hwang et al. | 437/152 |

FOREIGN PATENT DOCUMENTS

| | | | |
|---|---|---|---|
| 000622832 | 11/1994 | European Pat. Off. | 437/46 |
| 3-82154 | 4/1991 | Japan | 437/162 |
| 4-91425 A | 3/1992 | Japan | 437/46 |
| 4-354328 | 12/1992 | Japan | 437/950 |
| 5-95115 | 4/1993 | Japan | 437/29 |
| 6-132301 | 5/1994 | Japan | 437/46 |

*Primary Examiner*—John Niebling
*Assistant Examiner*—S. Mulpuri
*Attorney, Agent, or Firm*—George O. Saile; Stephen B. Ackerman

[57] ABSTRACT

This invention describes a new method for forming self-aligned silicide for application in MOSFET, and a new structure of MOSFET device featuring elevated source and drain, with the objectives of reducing silicide penetration into the source and drain junctions, of eliminating junction spikes, of obtaining smoother interface between the silicide and the silicon substrate, and of reducing the chance of bridging of the silicides on the gate and on the source and drain. The new structure is made by depositing an amorphous layer of silicon on a silicon substrate already patterned with field oxide, gate oxide, polysilicon gate, and silicon nitride spacer on the gate sidewalls. Novel oxide sidewall spacers are then created by first implanting nitrogen into the horizontal surface of the amorphous silicon layer and subsequently thermally oxidizing the part of the amorphous silicon on the vertical sidewalls that is not exposed to nitrogen implantation. A dopant implantation followed by an annealing at 600° C. in nitrogen converts the deposited silicon layer into elevated source and drains. A refractory metal, such as titanium is then deposited over the substrate and, upon rapid thermal annealing, reacts with the elevated source and drain polysilicon to form silicide without consuming the substrate silicon, and without ill effect on the source/drain junctions in the single crystalline silicon. The chance of silicide bridging is greatly reduced due to the special geometry of the novel sidewall oxide spacers.

15 Claims, 2 Drawing Sheets

MOS DEVICE STRUCTURE AND INTEGRATION METHOD

BACKGROUND OF THE INVENTION

1. Field of the Invention

This invention relates to a novel structure of MOSFET that is suitable for subhalf-micron, and especially useful for subquarter-micron devices, in semiconductor integrated circuits, and method for making the device structure using a special technique for self-aligned metal silicide.

2. Description of the Related Art

Higher performance and greater functional capacity in integrated circuits require semiconductor devices to be smaller and denser. Such requirements give rise to problems in increased parasitic capacitance, device contact resistance (gate, source and drain contacts in IGFET, or Insulated-Gate Field-Effect Transistors), and tight tolerance of pattern definition. Silicides are often used to reduced contact resistance. For very small modern silicon devices which are sub-micron, subhalf-micron, and even subquarter-micron, conventional photolithographic technique for patterning contacts will not meet the required tolerance of critical dimensions. The method of self-aligned silicide (salicide) formation, which self-registers with the contacts at the top of the polysilicon gate, the source and the drain, helps solve the problem of critical dimension tolerance. Salicides have thus become almost universal in today's high-density IGFET, which are also commonly referred to as MOSFET (Metal-Oxide-Semiconductor Field-Effect Transistors) even though the gate metal is now prevalently replaced by the polysilicon gate. There are, however, problems associated with prior art methods of salicide formation. One main problem is that the silicidation process of converting a refractory metal to its silicide is achieved by the consumption of silicon underlying the metal, and this means the consumption of substrate silicon in the regions of the source and drain. The source/drain junctions, already very shallow in subhalf-micron devices, can become unpredictably extremely thin. A further and very severe problem is that the silicidation reaction can consume substrate silicon unevenly, leading to ragged source/drain junctions and, even worse, the creation of spikes that can penetrate through the junctions near the edges of the source/drain areas. The following prior art patents illustrate various established method of forming salicide for use in MOS devices:

Osinski and Voors (U.S. Pat. No. 4,885,259, Dec. 5, 1989) describes a method of forming salicides for use in MOS devices: First, a layer of polysilicon, about 500 nm thick, doped to give a suitable conductivity, for example with phosphorus at a concentration of about $10^{20}$ atoms/cm$^3$, is deposited over a silicon substrate having a surface pattern of both gate oxide and field oxide, and then photolithographically etched into a gate structure with substantially vertical edges using anisotropic reactive ion etching. The edge of the polysilicon gate is then protected first by a thin layer of thermal oxide of about 35 nm and then a thicker layer of chemical vapor deposited (CVD) layer of oxide of about 300 nm, by a formation technique commonly referred as sidewall spacer formation. In this technique, the CVD oxide is deposited conformally over the surface topography of the substrate surface, including the polysilicon gate, the source and the drain, and the field oxide. The sidewall spacer is then created by anisotropical reactive ion etching, to the end when the underlying silicon beneath the source and the drain has just become exposed. A layer of refractory metal, such as titanium, is then deposited over a substrate surface containing both regions of exposed silicon and regions that are protected by silicon dioxide. It is followed by a rapid thermal treatment in a nitrogen atmosphere at 650° C. The titanium on exposed silicon reacts with silicon to form titanium silicide. The titanium on oxide does not undergo silicidation; it instead may form a layer of titanium nitride. Both the titanium nitride and the unreacted elemental titanium can be removed with a selective etchant such as a solution containing ammonia and hydrogen peroxide, while the titanium silicide remains in situ, thus forming a self-registered pattern of silicided contact areas. A second rapid thermal treatment can be applied to the silicide to reduce its electric resistivity.

There are a number of problems and disadvantages associated with this salicide formation process and structure: (1) in the silicidation of the titanium over the source and drain regions, the substrate silicon in these regions is consumed, resulting in shallow source/drain junction. It will often cause ragged source/drain junctions, and spikes especially near the edges of the source/drain windows. This consequently leads to device degradation. (2) It also results in higher series resistance of the LDD (lightly doped drain) region, suppressing the drain saturation current. (3) It additionally results in increased gate to source/drain capacitance, leading to slow device operating speed. (4) The sidewall spacer needs to be sufficiently thick, in this case 300 nm, in order to prevent bridging of silicides—a phenomenon in which the formation of titanium silicide is not just limited to the regions with which the titanium comes into direct contact, but also is spreading outward to some distance because of substantial lateral diffusion of silicon into the titanium layer. The minimum required spacer thickness limits the scale down of the device.

The invention of Moslehi (U.S. Pat. No. 5,322,809, Jun. 21, 1994) describes a method of salicide formation in which the source/drain junction penetration is reduced by slowing down the reaction between the refractory metal and the silicon substrate in the source and drain region. This goal is accomplished by first thermally growing a very thin layer of silicon nitride, about 5–20 Å, over the source and drain region and then the deposition of the titanium layer over it. The intervening thin layer of silicon nitride will eventually break down, allowing the silicidation of the titanium layer to take place. The slower and more limited consumption of silicon in the silicidation process is claimed to give smoother source/drain junctions than prior art. While the claimed main purpose of this invention is to be able to produce silicides of different thickness over the gate and the source/drain areas, it is unclear how well and precise can the reduced rate process of the silicidation be controlled by the intervening thin nitride film, whose breakup behavior would be a controlling factor. It is also unclear whether it is self-defeating in limiting the silicidation of the metal film to produce thinner silicide layer over the source/drain areas because, as described in the invention, the subsequent formation of contact holes in the dielectric over the source/drain areas may result in the etching of the already thin silicide and hence requires a deposition of another layer of metal film and a subsequent thermal processing to form additional silicide layer over the contact holes, thereby surely consuming additional substrate silicon there. Furthermore, the thin sidewalls on the polysilicon gate used in this invention may not be adequate for avoiding the bridging problem between the source/drain and the gate.

The invention of Havemann (U.S. Pat. No. 5,468,662, Nov. 21, 1995) describes a method of self-aligned silicide formation for integrated thin-film transistors (TFT) and conventional MOSFET. After the formation of the polysilicon gate of the conventional MOSFET, a blanket layer of oxide is deposited over the entire substrate. The TFT transistor is then built on the area of field oxide by depositing a polysilicon layer over the entire substrate, and then photolithographically patterned into a TFT mesa in an area of field oxide. A thin layer of oxide is then grown on the polysilicon mesa; but the patent does not described how this oxide can be etched to give leave both the gate oxide on the top of the TFT mesa as well as the mesa sidewalls, while removing oxide elsewhere except on the sidewalls of the gate of the conventional MOSFET. A layer of refractory metal such as titanium is then deposited over the substrate. Because, unlike the conventional MOSFET, there is no elemental silicon underneath the refractory metal at the TFT site, an amorphous silicon layer is deposited over the entire substrate and subsequently etched to form a pattern over the TFT. In subsequent annealing, this amorphous silicon layer react with the underlying metal layer to form silicide. Elsewhere in the integrated circuit, at the MOSFET site, this amorphous silicon overlayer is removed by etching. Therefore, the formation of the silicide over the source/drain area still depends on the reaction of the metal with its underlying silicon substrate, as in the usual manner of prior art with its usual problem of the consumption of the silicon substrate and the thinning of the source/drain junction.

SUMMARY OF THE INVENTION

This invention describes a process for forming salicide and fabricating a new structure of MOSFET devices featuring elevated source and drain, with the objective of reducing silicide penetration into the source and drain junctions, with the additional objective of obtaining smoother interface between the silicide and the silicon substrate, and with the further objective of reducing the chance of bridging of the silicides on the gate and on the source and drain, so as to bring consequential benefits of reduced series resistance in the source and drain of the MOSFET, reduced parasitic gate-to-source/drain capacitance, reduced device degradation problem due to ragged junction, decreased device failure due to silicide spikes into source/drain junctions, and improved device performance and reliability.

To fabricate the elevated source-drain MOSFET structure, the polysilicon gate is first formed in the usual manner by first growing a gate oxide on a silicon substrate and then depositing a layer of undoped polysilicon and then a layer of photoresist, and subsequently photolithographically patterned and anisotropically reactively ion-etched to form a polysilicon gate over the gate oxide. A layer of silicon nitride is then deposited over the entire substrate, and is subsequently selectively and anisotropically ion-etched until the end point when the substrate silicon in the source/drain areas and the polysilicon in the gate area just become exposed. This anisotropic ion etching leaves the gate sidewalls covered with silicon nitride. A layer of amorphous silicon is then anisotropically deposited on the substrate and then defined over the active regions using an active region definition mask, which is the same as masks generally used to define field oxides. The substrate is then exposed to nitrogen ion beams. The amorphous silicon over the gate and the source/drain areas, having surface perpendicular to the nitrogen ion beams, are implanted with nitrogen ions, resulting in piling up of high concentration nitrogen at the interface between native oxide and amorphous silicon. The sidewalls of the gate, being substantially shadowed from the nitrogen ion beams by the overhang of the amorphous silicon, receives very little nitrogen implantation and remain essentially elemental amorphous silicon. In a manner somewhat similar to LOCOS (LOCal Oxidation of Silicon), a subsequent thermal oxidation converts the the amorphous silicon on the sidewall into thermal silicon dioxide, complete with bird's beaks, until the oxidation is stopped at the sidewall silicon nitride. Meanwhile, the areas where nitrogen piles up at surface is protected from oxidation. A thin layer of oxynitride, formed on the amorphous silicon during the oxidation, is then removed by etching in a plasma containing $CHF_3$. The sidewall oxide so created is then thinned to about 500–1000 Å by etching in a plasma containing $CHF_3$. To make elevated source and drain, the substrate is then subjected to implantation, with $1\times10^{16}$ ions/cm$^2$ of $BF_2$ at 15 keV for PMOS, or $1\times10^{16}$ ions/cm$^2$ of P at 40 keV for NMOS. Upon rapid thermal annealing for 10–60 seconds, at 1000° C. for PMOS and 1050° C. for NMOS, the implanted doping atoms in the elevated source and drain will diffuse a very short distance into the silicon substrate and form shallow source and drain junctions in the single crystalline silicon. A layer of titanium of about 300–400 Å, or an other suitable refractory metal, is deposited over the substrate, and is then subjected to a rapid thermal annealing, at 650° to 750° C. in nitrogen ambient for 30 seconds, to form silicide by reacting with the recrystallized silicon in the gate as well as in the source and drain areas. The unsilicided titanium film on the gate side walls and on the field oxide areas is then removed by selective etching. The silicide film is subjected to a second rapid thermal annealing, at 800° to 900° C. in nitrogen ambient for 10–30 seconds, to decrease the silicide resistivity.

DESCRIPTION OF THE PREFERRED EMBODIMENTS

The following describes the preferred embodiments of the invention through the example of making an MOS device with self-aligned silicides for gate and source/drain contacts, with an elevated source and drain structure that avoids ragged and/or spiked source and drain junctions.

Figure 1:
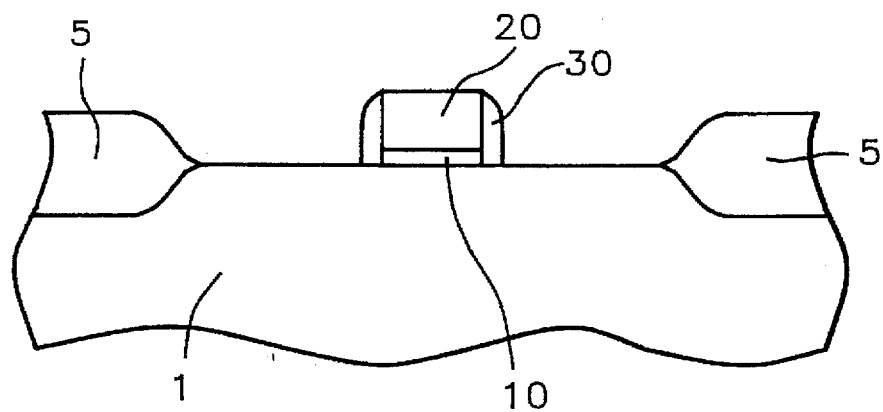
FIG. 1 shows a polysilicon gate with an intervening gate oxide and sidewall nitride within the active area defined by the field oxide.

FIG. 1 describes a structure after the formation of the polysilicon gate with silicon nitride sidewalls. Starting with the standard LOCOS process of forming a pattern of field oxide 5, a thin thermal oxide, 10, of about 55–120 Å, is grown in the active area of the silicon substrate 1. A layer of undoped polysilicon, about 1000–3500 Å thick, is then deposited using any of the conventional CVD (chemical vapor deposition) methods. The polysilicon layer is then made into a pattern of polysilicon gates, of which one is shown as 20 in FIG. 1, using any conventional method of photolithography and anisotropic reactive ion etching. A thin layer of silicon nitride, preferably 100 to 250 Å thick, is deposited conformally over the topography of the substrate, using any standard chemical vapor deposition method for silicon nitride. The substrate is then exposed to a selective anisotropic reactive ion etching plasma, which removes silicon nitride in all areas except the vertical sidewalls of the gate, thus forming insulating silicon nitride sidewall 30 on the gate.

Figure 2:
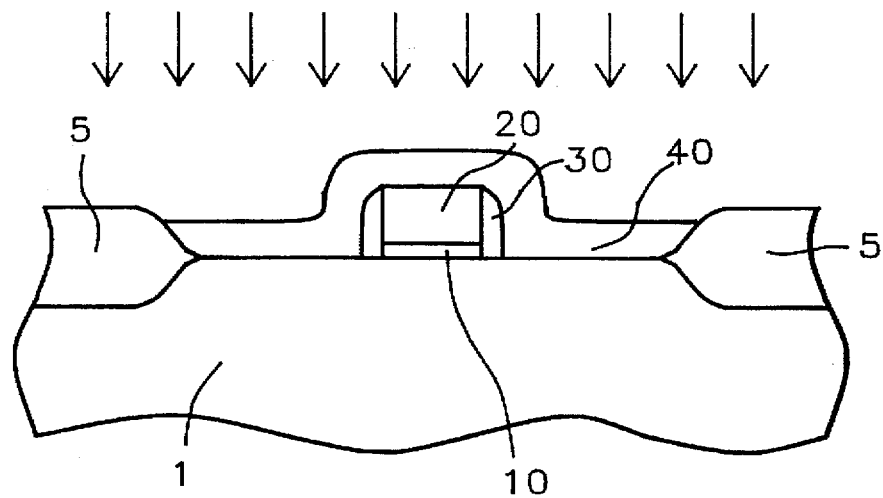
FIG. 2 shows the structure after the deposition and patterning of an amorphous silicon layer in the active area, and subsequently subjected to nitrogen implantation.

Referring to FIG. 2, a layer of amorphous silicon, about 500–1500 Å, is then anisotropically deposited on the substrate, using directed LPCVD at 570° C., or silicon sputter-deposition, or silicon MBE. The amorphous silicon layer is defined in the active region shown as 40, using an using an active region definition mask. The substrate is then exposed to a nitrogen ion beam, 45, at the implantation condition of 15–30 keV for a dose of $1\times10^{15}$ to $2\times10^{16}$ ions/cm$^2$. As a result, nitrogen piles up at the interface between the native oxide layer on amorphous silicon layer and the amorphous silicon layer in the gate and the source and drain areas where the surface of the amorphous silicon layer is perpendicular to the nitrogen ion beam. The sidewall amorphous silicon layer, with its surface shadowed from the nitrogen ion beam by film overhang, receives negligible nitrogen implant, and remains essentially elemental silicon.

Figure 3:
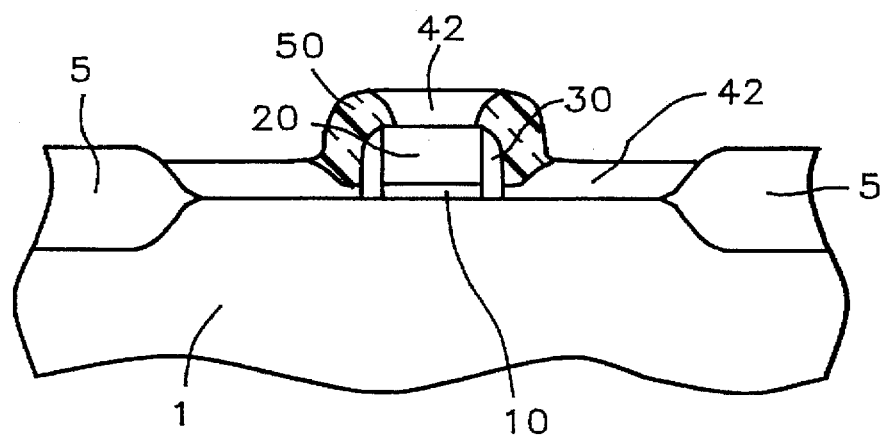
FIG. 3 shows the resulting structure after thermal oxidation of the structure shown in FIG. 2, with amorphous silicon converted into silicon dioxide outside the nitride sidewalls.

Referring now to FIG. 3, the substrate is then given a thermal oxidation at 1100° C. in wet oxygen for 0.5–1 hour, thereby converting the sidewall amorphous silicon into silicon dioxide 50. On the other hand, the amorphous silicon on the gate and the source and drain areas, due to a high concentration of nitrogen in it, is protected from oxidation. However, a thin silicon oxynitride is formed on the surface of the amorphous silicon film in these areas. Because of this, the sidewall oxide has a shape with double bird's beaks reminiscent of LOCOS field oxide. The thin silicon oxynitride is subsequently removed by etching in a plasma containing CHF$_3$.

Figure 4:
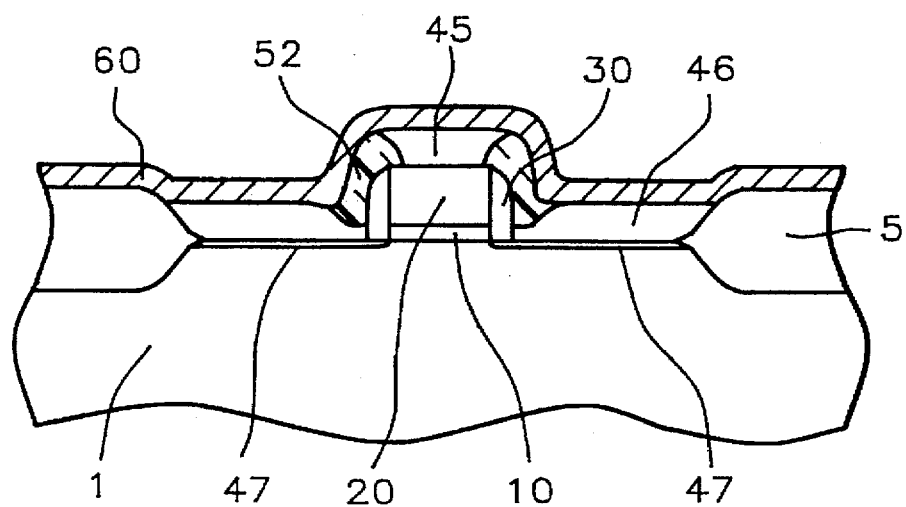
FIG. 4 shows the resulting structure after sidewall oxide thinning, source/drain implantation, crystallization of the amorphous silicon layer by rapid thermal annealing with the formation of elevated source and drain and the out-diffusion of the implanted dopant into the silicon substrate to form shallow source/drain junctions, and then titanium deposition.
Figure 5:
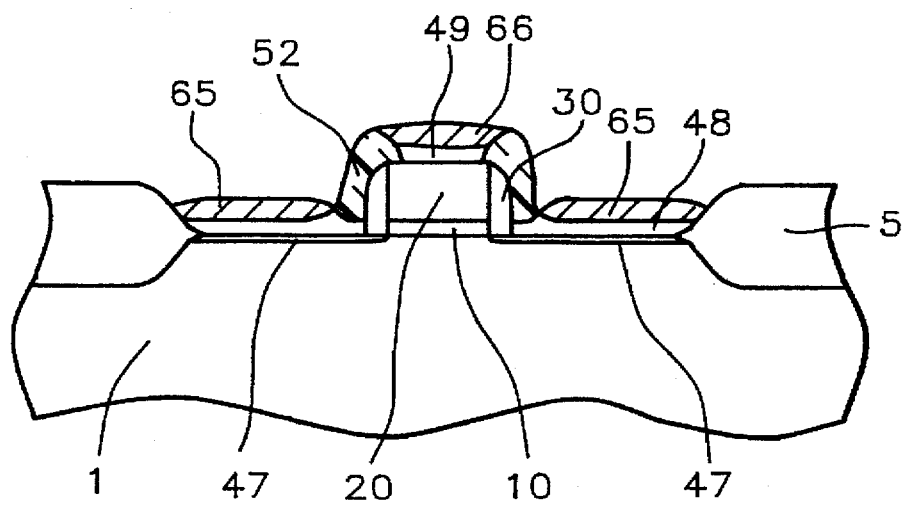
FIG. 5 shows the structure after the formation of salicide after rapid thermal annealing and removal of unsilicided titanium by selective etching.

Referring now to FIG. 4, the oxide spacer so created is then thinned to about 500–1000 Å by etching in a plasma containing CHF$_3$. The substrate is then subjected to implantation, with $1\times10^{16}$ ions/cm$^2$ of BF$_2$ at 15 keV for PMOS, or $2\times10^{15}$ to $1\times10^{16}$ ions/cm$^2$ of P at 20–80 keV (40 keV preferred) for NMOS. On the gate, this polysilicon, 45, then becomes part of the polysilicon gate on top of the original polysilicon gate, 20. In the source and drain areas, this polysilicon, 46, become elevated source and drain. A rapid thermal annealing is then carried out in a nitrogen atmosphere for 10–60 seconds, at 1000°±25° C. for PMOS and 1050°±25° C. for NMOS. This causes the implanted dopant to diffuse from the elevated source and drain, 46, into the single crystalline silicon substrate beneath them, to produce very shallow (about 200–1000 Å), yet very smooth and spike-free source/drain junctions, 47. It also causes the implanted dopant in 45 to diffuse into the undoped polysilicon 20 and impart required conductivity to the stacked polysilicon gate as a unit. We claim that this way of doping the polysilicon gate 20, rather than the usual in-situ doping during the CVD deposition of the polysilicon gate, will slow down the diffusion of gate dopant into and through the gate oxide 10, and consequently will better preserve the dielectric integrity of the gate oxide. Then a 300–400 Å layer of refractory metal such as titanium and cobalt is deposited on the substrate by sputtering. Upon the first rapid thermal annealing at 650°–750° C. for 30 seconds in a nitrogen atmosphere, the metal reacts with the underlying polysilicon in the gate area as well as in the source and drain areas, and is converted into silicide. Outside these areas, such as in the area of field oxide, and the area of the oxide sidewall spacers, where there is no elemental silicon, the metal does not undergo silicidation, and is subsequently removed with a selective etchant containing 1:1:1 NH$_4$OH:H$_2$O$_2$:H$_2$O at room temperature. This gives the resulting structure shown in FIG. 5, where the salicides 65 and 66 are produced. Since 65 and 66 are separated by the particular geometry of the oxide sidewall spacer, the chance of bridging is greatly reduced. Additionally, the particular geometry of the oxide sidewall spacer also allows the lower part of the elevated conductive polysilicon source and drain to get closer to the gate, and hence closer to the channel under the gate, resulting in reduced series resistance to the channel. A second rapid thermal annealing is then carried out at 800°–900° C. for 10–30 seconds in a nitrogen atmosphere to reduce the electric resistivity of the salicides.

While the above description of the preferred embodiments of this invention used the example for the fabrication of a simple MOS device, The particular structure of this device can also be used in various configurations of integrated circuits that contain MOS as a part, as in CMOS or biCMOS, and others which need not be enumerated. It is also apparent to those skill in the art of semiconductor integrated circuits that any variations from the embodiment described above can be made without deviating from the spirit of this invention to fabricate the novel MOS structure of this invention, including separately features such as elevated polysilicon source and drain, and the formation of sidewall oxide spacer through nitrogen implantation of amorphous or, by simple extrapolation, polysilicon followed by subsequent thermal oxidation. It is also understood that, while MOS stands for Metal-Oxide-Semiconductor, where the metal constitutes the gate material but is now usually substituted with doped polysilicon, especially in submicron devices.

What is claimed is:

1. A method of making MOS devices with salicided gate and source and drain, comprising the steps of a. forming a pattern of field oxide on a silicon substrate using LOCOS;

b. thermally growing a gate oxide layer on the silicon substrate in the active area defined by the field oxide window;

c. depositing a layer of polysilicon over the substrate;

d. depositing a layer of photoresist over the polysilicon, exposing the photoresist through a gate definition mask, developing the photoresist;

e. anisotropically reactive-ion etching the polysilicon and the gate oxide to form the polysilicon gate and the gate oxide, followed by the removal of the photoresist;

f. covering the substrate with a layer of silicon nitride by chemical vapor deposition;

g. anisotropically reactive-ion etching the silicon nitride to the end point defined by the exposure of the silicon substrate, thus forming the gate's first sidewall spacer of silicon nitride;

h. then conformally depositing a layer of amorphous silicon over the topography of the silicon substrate, and defining the pattern using an active region definition mask;

i. implanting nitrogen into the amorphous silicon layer whereby as a result, nitrogen piles up at the interface between the native oxide layer on the amorphous silicon layer and the amorphous silicon layer in the gate and the source and drain areas where the surface of the amorphous silicon layer is perpendicular to the nitrogen ion beam;

j. thermally oxidizing the amorphous silicon in the sidewall areas not implanted with nitrogen to form the gate's second sidewall of silicon dioxide;

k. implanting dopant into the amorphous silicon layer;

l. converting the amorphous silicon into polysilicon layer by annealing;

m. annealing to drive some implanted dopant into the single silicon substrate in the source and drain area to form shallow junctions, as well as into the polysilicon gate;

n. depositing a layer of refractory metal on polysilicon layer, followed by a first rapid thermal annealing to form silicide of the refractory metal;

o. removing the unsilicided metal covering the areas of field oxide and gate sidewall oxide; and p. a second rapid thermal annealing to improve the conductivity of the silicide.

2. The method of claim 1 wherein said polysilicon gate is undoped in-situ, but is later doped by diffusion from a top layer polysilicon converted from an ion implanted amorphous silicon.

3. The method of claim 1 wherein said silicon nitride has a thickness between 100 and 250 Å.

4. The method of claim 1 wherein said amorphous silicon is made by anisotropic directed low-pressure chemical vapor deposition.

5. The method of claim 1 wherein said amorphous silicon is made by directed anisotropic sputtering.

6. The method of claim 1 wherein said amorphous silicon layer has a thickness between 500 and 1500 Å.

7. The method of claim 1 wherein said implanting nitrogen into amorphous silicon uses an ion energy of 10–30 kev, and dose is $1\times10^{15}$–$2\times10^{16}$ ions/cm2.

8. The method of claim 1 wherein said implantation dopant into amorphous silicon is phosphorus for NMOS, the ion energy is 20–80 kev, and the dose is $2\times10^{15}$–$1\times10^{16}$ ions/cm$^2$.

9. The method of claim 1 wherein said annealing for driving implanted dopants to for shallow source/drain junction is by rapid thermal annealing at 1000°±25° C. for 10–60 sec for PMOS, and at 1050°±25° C. for 10–60 sec for NMOS.

10. The method of claim 1 wherein said refractory metal is titanium, and the silicide is titanium silicide.

11. The method of claim 10 wherein said titanium layer has a thickness of 300–400 Å.

12. The method of claim 1 wherein said refractory metal is cobalt, and the silicide is cobalt silicide.

13. The method of claim 12 wherein said cobalt layer has a thickness of 300–400 Å.

14. The method of claim 1 wherein said first rapid thermal annealing to form silicide is carried out at 650°–750° C. for 30 seconds in a nitrogen atmosphere.

15. The method of claim 1 wherein said second rapid thermal annealing to improve silicide conductivity is carried out at 800°–900° C. for 10–30 seconds in a nitrogen atmosphere.

* * * * *